United States Patent

Ebinuma

[11] Patent Number: 5,347,561
[45] Date of Patent: Sep. 13, 1994

[54] X-RAY EXPOSURE APPARATUS AND SEMICONDUCTOR-DEVICE MANUFACTURING METHOD

[75] Inventor: Ryuichi Ebinuma, Machida, Japan
[73] Assignee: Canon Kabushiki Kaisha, Tokyo, Japan
[21] Appl. No.: 168,412
[22] Filed: Dec. 17, 1993

Related U.S. Application Data

[63] Continuation of Ser. No. 966,846, Oct. 27, 1992, abandoned.

[30] Foreign Application Priority Data

Nov. 1, 1991 [JP] Japan .................................. 3-315417

[51] Int. Cl.$^5$ .................................................. G21K 5/00
[52] U.S. Cl. .......................................... 378/34; 378/97; 378/204
[58] Field of Search ...................... 378/34, 35, 97, 160, 378/204, 210

[56] References Cited

U.S. PATENT DOCUMENTS

| | | | |
|---|---|---|---|
| 5,134,640 | 7/1992 | Hirokawa et al. | 378/34 |
| 5,170,418 | 12/1992 | Ebinuma | 378/34 |
| 5,172,403 | 12/1992 | Tanaka | 378/34 |

FOREIGN PATENT DOCUMENTS

| | | | |
|---|---|---|---|
| 0178660 | 4/1986 | European Pat. Off. | |
| 049613 | 2/1992 | Japan | 378/34 |
| 049614 | 2/1992 | Japan | 378/34 |

OTHER PUBLICATIONS

Patent Abstracts of Japan, Kokai No. 61-035450, vol. 10, No. 190, Jul. 1986.
Patent Abstracts of Japan, Kokai No. 02-100311, vol. 14, No. 308, Jul. 1990.
Patent Abstracts of Japan, Kokai No. 03-101216, vol. 15, No. 288, Jul. 1991.

Primary Examiner—David P. Porta
Attorney, Agent, or Firm—Fitzpatrick, Cella, Harper & Scinto

[57] ABSTRACT

X-rays enter an airtight chamber through a beam duct, pass through a transmission window, and expose a wafer and mask disposed outside the airtight chamber. The wafer and mask are held by a wafer chuck and a mask holder, respectively. The mask holder includes a pressure sensor, which detects variations in the atmospheric pressure. An output from the pressure sensor is converted into a change in the intensity of the x-rays by an arithmetic unit, and is transmitted to a control unit, which controls a driving unit of a shutter. By thus controlling the moving speed of the shutter in accordance with variations in the atmospheric pressure, it is possible to prevent variations in the amount of x-ray exposure of the wafer.

19 Claims, 4 Drawing Sheets

X-RAY EXPOSURE APPARATUS AND SEMICONDUCTOR-DEVICE MANUFACTURING METHOD

This application is a continuation of prior application, Ser. No. 07/966,846 filed Oct. 27, 1992, now abandoned.

BACKGROUND OF THE INVENTION

1. Field of the Invention

This invention relates to an x-ray exposure apparatus for exposing a pattern on a substrate, such as a wafer or the like, using soft x-rays or the like, and a semiconductor-device manufacturing method using such an apparatus.

2. Description of the Prior Art

X-ray exposure apparatuses have been proposed which use synchrotron radiation (SOR) light or other kinds of soft x-rays, and in which the portion of the optical path of illuminating light which is located before a mask is disposed in a vacuum or in a He atmosphere to reduce the attenuation of x-rays, while the mask, a substrate (such as a wafer or the like) units to carry these components, and the like are disposed in air.

An exposure method which utilizes x-rays as illuminating light is effective for printing a circuit pattern having a fine line width which is less than the limit of the resolution of a reduction projection exposure apparatus which utilizes ultraviolet rays.

In order to realize such a fine line width, each of the factors which cause errors in the accuracy of the line width must be controlled within a predetermined accuracy.

These factors, for example, relate to accuracy in the production of the mask, a resist process for the wafer, and the resolution of the exposure apparatus.

An x-ray exposure apparatus, in general, adopts a so-called proximity exposure method in which an exposure operation is performed while a mask is disposed close to a wafer. In this method, the line width of a pattern to be exposed is influenced, for example, by Fresnel diffraction due to pattern edges of the mask, and the half shadow of illuminating light. The degree of such influence varies in accordance with variations in the amount of exposure, which is the product of the exposure time and the intensity of illuminating light or the absorption power of a resist.

Accordingly, in order to increase the resolution of the exposure apparatus and precisely control the line width of a pattern to be printed, it is necessary to precisely control the amount of exposure.

The specifications of the necessary control accuracy of the amount of exposure of an exposure apparatus are calculated in the following manner.

If the target accuracy of the line width of a pattern is assumed to be ±5% for a line width of 0.3 μm, the line width must be controlled within a range of 0.3×0.05=0.015 (μm). If the portion of the overall error allocated to the printing accuracy of the exposure apparatus is assumed to be half the overall value, then the permissible variation in printing accuracy equals 0.015×½=0.0075 (μm). That is, variations in the line width caused by the exposure apparatus must be controlled within 0.0075 μm.

The influence of control accuracy of the amount of exposure on the line width due to Fresnel diffraction and half shadow of the light source of the apparatus is described, for example, in NTT R & D, April 1990, p. 605.

According to the result of experiments in this report, the line width changes 0.002 μm when the amount of exposure changes 1%. This value substantially coincides with the result of calculation made in consideration of Fresnel diffraction and the like.

Accordingly, in order to provide accuracy in the line width of less than 0.0075 μm, the following relationship must be satisfied:

$$0.2 \times \Delta D/D < 0.0075$$

$$\Delta D/D < 0.0375,$$

where, $\Delta D/D$ is the control accuracy of the amount of exposure.

That is, the control accuracy of the amount of exposure must be controlled within 3.75%.

The following factors which cause errors in the amount of exposure can be considered.

These factors comprise variations in the intensity of the light source, variations in the reflectivity of an x-ray mirror used in an x-ray optical system for expanding the exposure region and selecting x-rays having a predetermined wavelength, variations in the thickness of a partition window between the air and a He atmosphere or a vacuum-tight chamber for guiding illuminating light, variations in the density of He or the air in the optical path of illuminating light due to variations in the temperature or pressure of He or the air, variations in the thickness of a mask membrane, accuracy in the setting of the exposure time, and the like.

Among these factors, variations in the pressure of the air have the following influence.

If x-rays having a wavelength of 10 Å pass a distance of 10 mm in air having a pressure of 1 atm, the intensity of the x-rays is attenuated about 90%. If the pressure changes 1% in this state, the intensity of the x-rays after passing that distance changes about 2.3%.

This value is not a negligible amount since the combined factors which cause errors in the amount of exposure must be controlled within the accuracy of about 3.75%.

SUMMARY OF THE INVENTION

It is an object of the present invention to improve the control accuracy of the amount of exposure in an x-ray exposure apparatus by reducing variations in the amount of exposure caused by variations in the atmospheric pressure.

It is another object of the present invention to provide a semiconductor-device manufacturing method which uses the above-described x-ray exposure apparatus.

According to a first aspect of the present invention, an x-ray exposure apparatus includes substrate holding means and original holding means for holding a substrate and an original, respectively. Adjustment means is provided for adjusting an amount of x-ray exposure, and pressure detection means is provided for detecting atmospheric pressure information on the vicinity of the substrate. Calculation means are provided for calculating the intensity of the x-ray exposure based on a detection output from the pressure detection means, and control means is provided for controlling the adjustment means in accordance with a result calculated by said calculation means.

According to another aspect of the present invention, an x-ray exposure method includes setting an original and a substrate at predetermined positions and detecting atmospheric pressure information in the vicinity of the substrate. Variations in the intensity of x-rays are then calculated based on a result of the detection, and an amount of x-ray exposure is controlled in accordance with a result of the calculation.

According to yet another aspect of the present invention, a semiconductor-device manufacturing method includes preparing a wafer and a mask having a circuit pattern and setting the mask and the wafer at predetermined positions. Atmospheric pressure information in the vicinity of the wafer is detected, and variations in the intensity of x-rays are calculated based on a result of the detection step. An amount of x-ray exposure is then controlled in accordance with a result of the calculation.

According to still a further aspect of the present invention, a semiconductor device is provided which is manufactured by a method which includes preparing a wafer and a mask having a circuit pattern and setting the mask and the wafer at predetermined positions. Atmospheric pressure information in the vicinity of the wafer is detected, and variations in the intensity of x-rays are calculated based on a result of the detection step. An amount of x-ray exposure is then controlled in accordance with a result of the calculation.

These and other objects, advantages and features of the present invention will become more apparent from the following description of the preferred embodiments taken in conjunction with the accompanying drawings.

DESCRIPTION OF THE PREFERRED EMBODIMENTS

Figure 1:
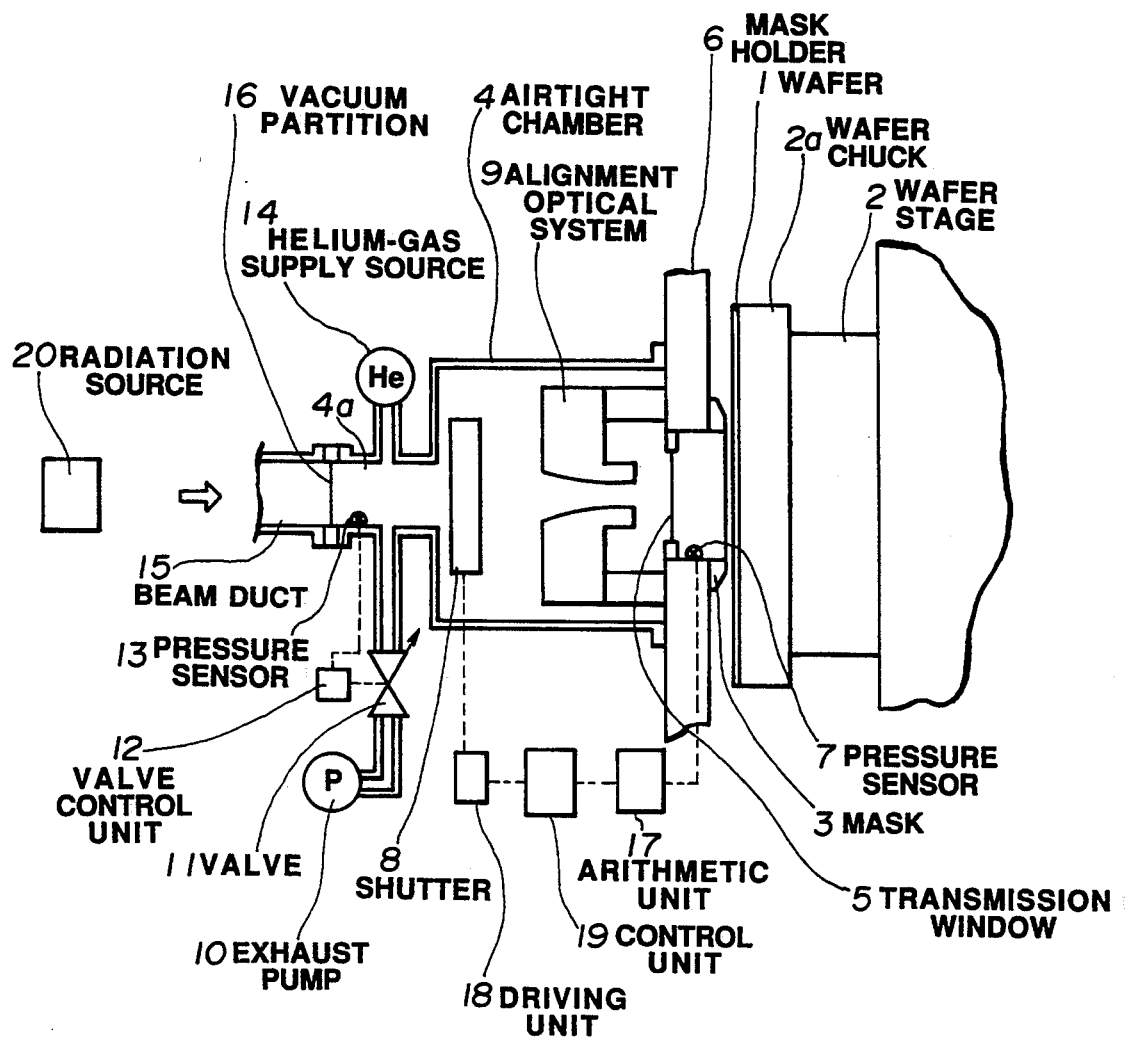
FIG. 1 is a diagram illustrating the configuration of an x-ray exposure apparatus according to an embodiment of the present invention.

FIG. 1 is a diagram illustrating the configuration of an x-ray exposure apparatus according to one preferred embodiment of the present invention. In FIG. 1, a wafer 1, serving as a substrate, is held by a wafer chuck 2a, serving as a substrate holding means, provided on a wafer stage 2, and is disposed at a position close to a transmission window 5 of an airtight chamber 4. A mask holder 6, serving as an original holding means for holding a mask 3, serving as an original, is disposed at one end of the airtight chamber 4, and supports a pressure sensor 7 for detecting variations in the atmospheric pressure between the transmission window 5 and the wafer 1. A shutter 8, serving as an exposure-amount adjustment means for controlling the amount of exposure for the wafer 1, and an alignment optical system 9 for detecting the relative position of the mask 3 with respect to the wafer 1 are accommodated within the airtight chamber 4. The alignment optical system 9 aligns the mask 3 with the wafer 1 by controlling the position of the mask holder 6.

After reducing the pressure in the airtight chamber 4 by an exhaust system comprising an exhaust pump 10, a valve 11 and a pressure sensor 13, the airtight chamber 4 is filled with helium gas supplied from a helium-gas supply source 14. A vacuum partition 16, made of beryllium or the like, is provided between a beam duct 15, maintained in a vacuum, for introducing x-rays to the airtight chamber 4, and an opening 4a of the airtight chamber 4.

An output from the pressure sensor 7 representing atmospheric-pressure information is converted into a signal representing variations in the attenuation of x-rays due to the atmospheric pressure by an arithmetic unit 17, and the signal is transmitted to a control unit 19 for controlling a driving unit 18 which drives the shutter 8.

A radiation source 20 comprises an SOR device or the like, and generates x-rays. The x-rays emitted from the radiation source 20 are introduced from the beam duct 15 to the airtight chamber 4. They then pass through the shutter 8 and the transmission window 5, and reach the mask 3 and the wafer 1 which are disposed in air. Although the mask 3 and the wafer 1 are disposed at positions close to the transmission window 5, the attenuation of the intensity of the x-rays due to the air is rather large.

Accordingly, it is possible to prevent variations in the amount of x-ray exposure for the wafer 1 by reducing the attenuation of the intensity of the x-rays. The attenuation is reduced by bringing the wafer 1 as close to the transmission window 5 as possible, and by detecting variations in the atmospheric pressure by the pressure sensor 7, calculating variations in the intensity of the x-rays by the arithmetic unit 17 using the output of the pressure sensor 7, and controlling the shutter 8 by the control unit 19 and the driving unit 18 according to the output of the arithmetic unit 17.

The calculation of variations in the intensity of the x-rays is performed, for example, in the following way. The x-rays, serving as illuminating light, are attenuated by the layer of the air present between the transmission window 5 and the wafer 1 which is coated with a resist. The attenuation factor changes in accordance with variations in the density of the air layer.

If the transmittance of x-rays having a wavelength $\lambda$ is represented by $\eta$, the rate of variation of the density of the air is represented by $\Delta x$, and the transmittance when $\Delta x = 0$ is represented by $\eta_0$, and if $\Delta x$ is small, variations in the transmittance caused by variations in the density of the air can be represented by:

$$\Delta \eta = \Delta x \ln \eta_0.$$

The transmittance $\eta$ of x-rays changes in accordance with the wavelength of the x-rays. If the thickness of the air layer between the transmission window 5 and the wafer 1 coated with a resist is assumed to be 10 mm, about 10% of x-rays having a wavelength of 10 Å pass through the air layer, i.e., $\eta_0 = 0.1$. If no countermeasure is taken, variations in the transmittance result in variations in the amount of exposure. In order to maintain the value of the variations within the above-described control accuracy, that is, $|\Delta \eta| < 0.0375$, the following inequality must be satisfied:

$$|\Delta x| < |0.0375/\ln 0.1| = 0.0163.$$

The exposure apparatus is in general placed in a clean chamber where temperature control is performed with a temperature control accuracy of about ±0.1° C.

However, the atmospheric pressure is not controlled. If the temperature is assumed to be 23° C., the control accuracy of ±0.1° C. causes variations in the density of the air of 0.1/(273+23)=0.000338. This value is less than the above-described value, and is therefore a sufficient value.

On the other hand, the atmospheric pressure may change about 20 mbar relative to 1013 mbar. Such a value causes variations in the density of 20/1013=0.01974, which cannot be neglected compared with the above-described value.

In order to overcome this problem, a method may be considered in which variations in the pressure are reduced by controlling the pressure of the clean chamber in which the exposure apparatus is placed. However, the control of the pressure of the chamber requires a complicated apparatus.

In the present embodiment, the pressure of the chamber is measured by the pressure sensor 7, the transmittance of illuminating light for each wavelength at the pressure is calculated by the arithmetic unit 17, and the power absorbed by the resist is calculated, whereby an appropriate exposure time is determined to correct the amount of exposure to have a predetermined value. It is only necessary that the timing of the correction follows the speed of variations in the atmospheric pressure. Hence, the correction is not necessarily performed at every exposure operation.

The value of variations in the transmittance change for each wavelength. Hence, ideally, the transmittance for each wavelength at the pressure must be calculated, and a change of the total amount of the illuminating light must be obtained in consideration of the energy absorbed by the resist and weighting. However, a simple alternative method may be adopted in which the correction value is obtained by multiplying a change in the pressure by a constant within a permissible range of the control accuracy of the amount of exposure.

The above-described calculation processing will be explained in detail.

When the wavelength spectrum of an x-ray light source, such as SOR light or the like, has a certain width, the amount of exposure absorbed by a wafer is determined by the following expression:

$$D = \Delta t \cdot i(\rho)$$
$$= \Delta t \int_\lambda \eta(\lambda,\rho) \cdot \eta_m(\lambda) \cdot \alpha(\lambda) \cdot I(\lambda) d\lambda,$$

where $\eta(\lambda, \rho)$ is the x-ray transmittance of the air as a function of $\lambda$ and $\rho$, $\eta_m(\lambda)$ is the x-ray transmittance of the mask membrane as a function of $\lambda$, $\alpha(\lambda)$ is the x-ray absorptance of the resist as a function of $\lambda$, $I(\lambda)$ is the intensity of x-rays immediately after the vacuum partition as a function of $\lambda$, $\lambda$ is the wavelength of x-rays, $\rho$ is the density of the air, $\Delta t$ is the exposure time, $i(\rho)$ is the intensity of x-rays absorbed by the resist, and $D$ is the amount of exposure absorbed by the resist.

In the case of SOR light, $\lambda$ is distributed in the range of about 1 Å–100 Å. In this range, since the above-described parameters greatly differ in accordance with the wavelength of x-rays, they are expressed as functions of the wavelength $\lambda$.

A description has already been provided about the fact that the transmittance of the air portion through which the exposure light passes differs in accordance with the density of the air.

The arithmetic unit 17 first calculates the value of the density of the air from the value of the pressure of the air to obtain variations in the density of the air. Subsequently, the value $\eta$ for each wavelength which is necessarily determined from conditions (such as the distance between the vacuum partition and the mask, the density and purity of the air, and the like) peculiar to the apparatus is read, and the value $\eta$ is corrected (the method of correction has already been described). The values $\eta_m$, $\alpha$ and I for each wavelength are also read from the data string, and the value i is calculated (Data of the parameters $\eta$, $\eta_m$, $\alpha$ and I for each wavelength are previously input to the storage device of the arithmetic unit 17. As for the value $\eta$, the value $\eta_0$ at the standard pressure is input to the data).

In practice, the calculation of $$\int_\lambda d\lambda$$

is performed as $$\sum_\lambda \Delta\lambda.$$

The value $\Delta t$ may be set so that the amount D has a predetermined value.

If the following approximation holds:

$$di/d\rho = d/d\rho \int_\lambda \eta(\lambda,\rho) \cdot \eta_m(\lambda) \cdot \alpha(\lambda) \cdot I(\lambda)d\lambda$$

$$\approx \alpha \text{ (constant)},$$

the value $i(\rho)$ may be represented by $$i(\rho)=\alpha \cdot \Delta\rho i(\rho_o),$$

where $\rho_o$ is the value of the standard pressure, and $\Delta\rho$ is the difference between the standard pressure and the detected pressure.

The arithmetic unit 17 can calculate the value $i(\rho)$ from the difference $\Delta\rho$ and the value $i(\rho_o)$, and determine the value $\Delta t$.

In the present embodiment, radiative light from an SOR device is used as illuminating light, whose intensity distribution and wavelength distribution have variations within the exposure region. In order to obtain a uniform amount of exposure within the exposure region by correcting the intensity distribution and wavelength distribution of the illuminating light, methods have been known in which, for example, the exposure time is locally changed using an exposure shutter, or the amount of exposure is adjusted by changing the scanning speed of a mirror of an illuminating system. In the present embodiment, since information on the atmospheric pressure is obtained, it is preferable to feed back the information on the atmospheric pressure to the above-described adjustment of the amount of exposure. More specifically, the profile of the setting of the exposure time within the exposure region may be changed in accordance with variations in the atmospheric pressure, or the profile of the scanning speed of the illuminating system may be changed in accordance with variations in the atmospheric pressure.

It is more preferable to control the driving unit 18 in accordance with variations in the temperature and humidity of the air, and variations in the pressure, temperature, purity and the like of the helium gas within the airtight chamber, and the like, in addition to the above-described variations in the atmospheric pressure.

Figure 2:
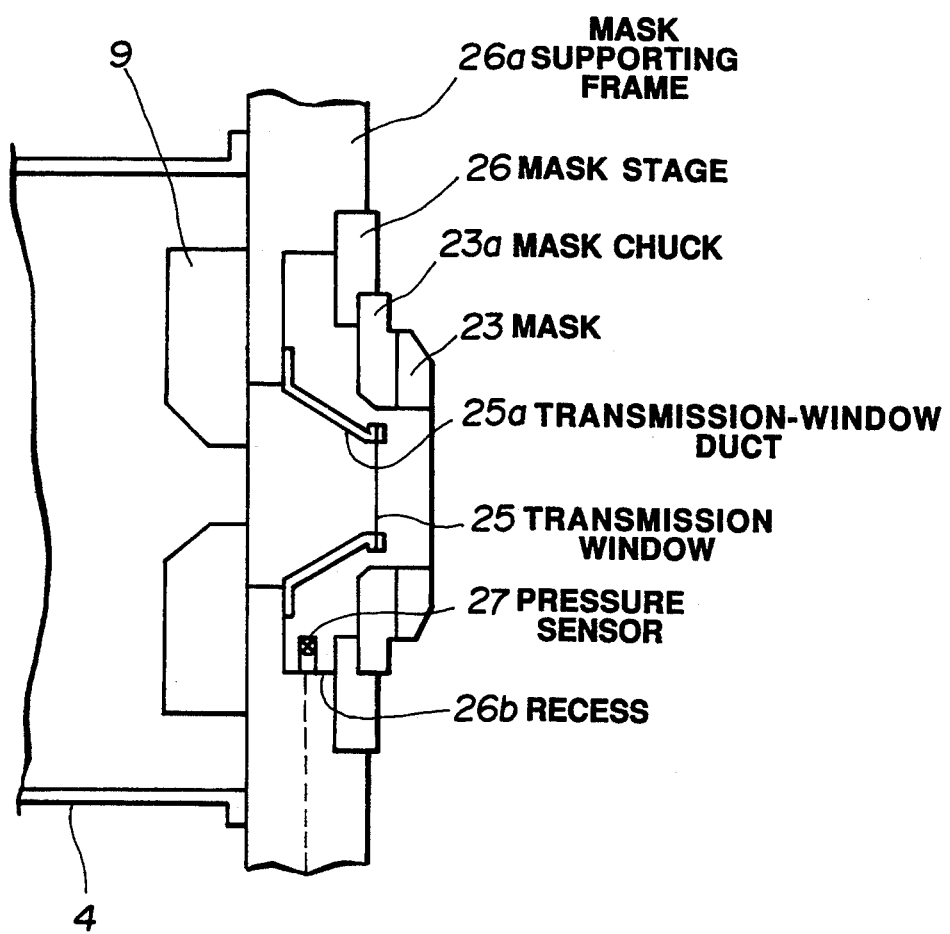
FIG. 2 is a cross-sectional view showing a specific example of a mask supporting member.

FIG. 2 is a cross-sectional view showing a specific example of a mask supporting member designed so that a mask is as close to a transmittance window as possible. In this example, a mask chuck 23a for holding a mask 23 is supported by a mask stage 26 of a mask-supporting frame 26a fixed to one end of the airtight chamber 4. The mask-supporting frame 26a has a recess 26b, where a transmission-window duct 25a, one end of which is fixed to the mask-supporting frame 26a, is disposed. The transmission window 25 is supported at the other end of the transmission-window duct 25a. A pressure sensor 27 is disposed outside the transmission window 25 within the recess 26b. By bringing the transmission window 25 as close to the mask 23 as possible by means of the transmission-window duct 25a, the attenuation of x-rays due to the air is prevented.

As described above, according to the present embodiment, variations in the intensity of illumination caused by variations in the atmospheric pressure can be prevented. Hence, it is possible to improve the control accuracy of the amount of exposure and to improve resolution.

Next, an explanation will be provided of a semiconductor-device manufacturing method utilizing the above-described x-ray exposure apparatus according to another embodiment of the present invention.

Figure 3:
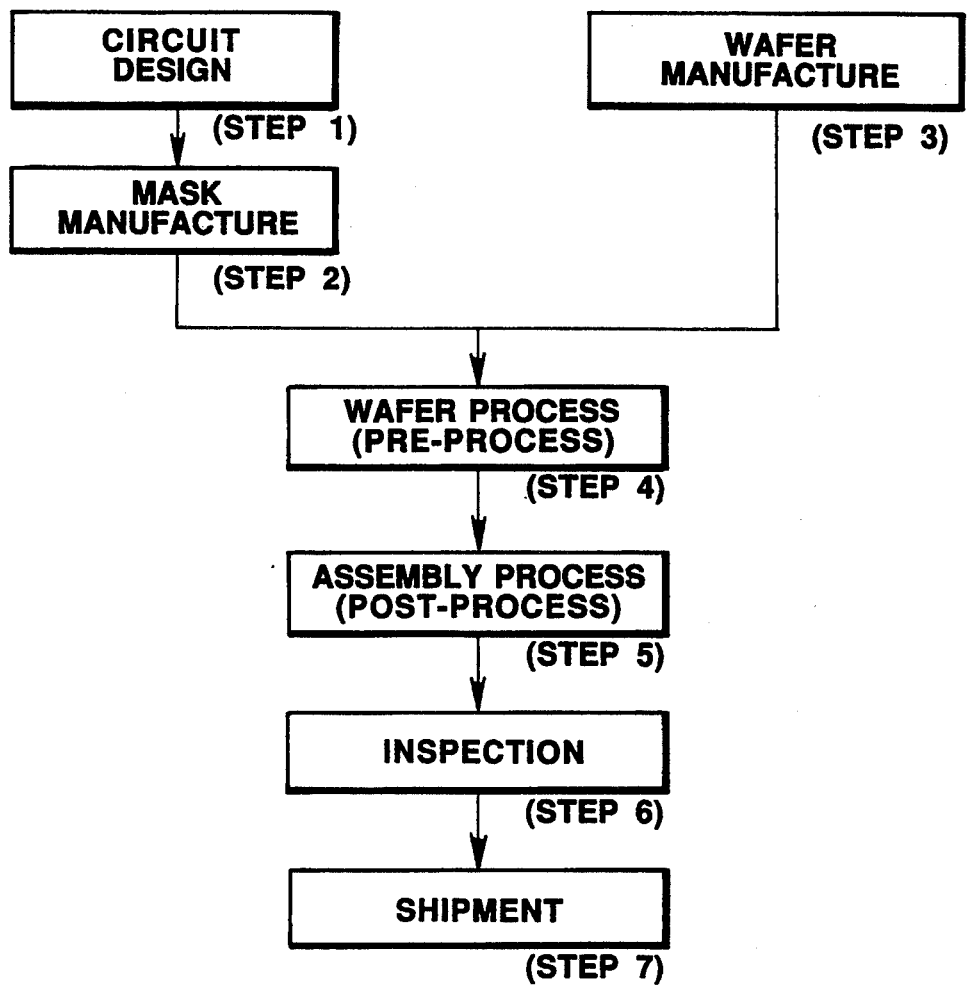
FIG. 3 is a diagram showing a flow for manufacturing semiconductor devices.

FIG. 3 shows a flow of steps for manufacturing semiconductor devices (semiconductor chips of IC's (integrated circuits), LSI's (large-scale integrated circuits) or the like, liquid-crystal panels, CCD's (charge-coupled devices), or the like). In step 1 (circuit design), circuit design of semiconductor devices is performed. In step 2 (mask manufacture), masks on which designed circuit patterns are formed are manufactured. In step 3 (wafer manufacture), wafers are manufactured using a material, such as silicon or the like. Step 4 (wafer process) is called a preprocess, in which actual circuits are formed on the wafers by means of photolithography using the above-described masks and wafers. The next step 5 (assembly process) is called a postprocess which manufactures semiconductor chips using the wafers manufactured in step 4, and includes an assembling process (dicing and bonding), a packaging process (chip encapsulation), and the like. In step 6 (inspection), inspection operations, such as operation-confirming tests, durability tests and the like of the semiconductor devices manufactured in step 5, are performed. The manufacture of semiconductor devices is completed after passing through the above-described processes, and the manufactured devices are shipped (step 7).

Figure 4:
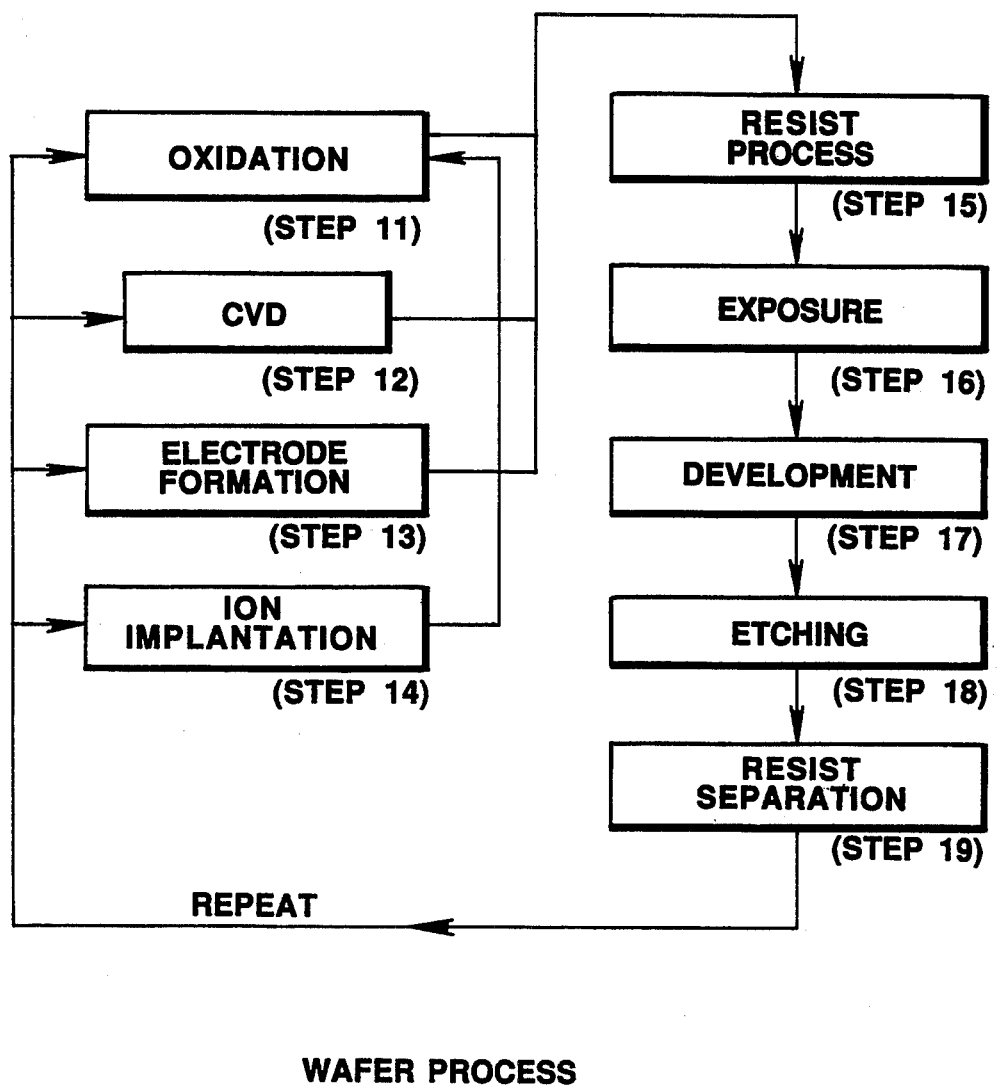
FIG. 4 is a diagram showing the detailed flow of a wafer process.

FIG. 4 shows the detailed flow of the above-described wafer process. In step 11 (oxidation), the surface of the wafer is oxidized. In step 12 (CVD), an insulating film is formed on the surface of the wafer. In step 13 (electrode formation), electrodes are formed on the surface of the wafer by vacuum deposition. In step 14 (ion implantation), ions are implanted into the wafer. In step 15 (resist process), a photosensitive material is coated on the wafer. In step 16 (exposure), the circuit pattern on the mask is exposed and printed on the wafer by the above-described x-ray exposure apparatus. In step 17 (development), the exposed wafer is developed. In step 18 (etching), portions other than the developed resist image are etched off. In step 19 (resist separation), the resist which becomes unnecessary after the completion of the etching is removed. By repeating these steps, a final circuit pattern made of multiple patterns is formed on the wafer.

By using the manufacturing method of the present embodiment, it is possible to manufacture semiconductor devices with a high degree of integration which have previously been difficult to manufacture.

The individual components shown in outline or designated by blocks in the drawings are all well-known in the semiconductor device exposure arts, and their specific construction and operation are not critical to the operation or best mode for carrying out the invention.

While the present invention has been described with respect to what is presently considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An x-ray exposure apparatus, comprising:
   substrate holding means for holding a substrate in atmosphere;
   original holding means for holding an original having a pattern;
   adjustment means for adjusting an amount of x-ray exposure to the original and the substrate;
   pressure detection means for detecting atmospheric pressure information in the vicinity of the substrate;
   calculation means for calculating intensity information of the x-rays irradiating the substrate, based on a detection output from said pressure detection means; and
   control means for controlling said adjustment means in accordance with a result calculated by said calculation means.

2. An apparatus according to claim 1, wherein the substrate held by said substrate holding means is situated outside an airtight chamber surrounding a portion of an optical path of the x-rays.

3. An apparatus according to claim 1, wherein said calculation means calculates transmittance of each wavelength included in the x-rays.

4. An apparatus according to claim 1, further comprising a radiation source for emitting the x-rays.

5. An apparatus according to claim 4, wherein said radiation source comprises a synchrotron radiation (SOR) device.

6. An apparatus according to claim 1, further comprising alignment detection means for detecting the relative positional relationship between the original and the substrate.

7. An apparatus according to claim 1, wherein said adjustment means comprises a shutter.

8. An apparatus according to claim 7, wherein said control means controls a driving profile for driving said shutter.

9. A semiconductor device manufactured by a method comprising the steps of:
   preparing a mask having a circuit pattern, and a wafer;
   setting the mask and the wafer at predetermined positions, wherein at least the wafer is in atmosphere;
   detecting atmospheric pressure information in the vicinity of the wafer;

calculating intensity information of x-rays irradiating the wafer, based on a result of said detecting step; and controlling an amount of x-ray exposure in accordance with a result of said calculating step.

10. An x-ray exposure method, comprising the steps of:

setting a substrate at a predetermined position in atmosphere;

detecting atmospheric pressure information in the vicinity of the substrate;

calculating intensity information of x-rays irradiating the substrate, based on a result of said detecting step; and controlling an amount of x-ray exposure to the substrate in accordance with a result of said calculating step.

11. A semiconductor-device manufacturing method, comprising the steps of:

preparing a mask having a circuit pattern, and a wafer;

setting the mask and the wafer at predetermined positions, wherein at least the wafer is in atmosphere;

detecting atmospheric pressure information in the vicinity of the wafer;

calculating intensity information of x-rays irradiating the wafer, based on a result of said detecting step; and controlling an amount of x-ray exposure in accordance with a result of said calculating step.

12. An X-ray exposure apparatus comprising:

a chuck for holding a substrate in atmosphere;

adjustment means for adjusting an amount of X-ray exposure to the substrate;

a detector for detecting information corresponding to atmospheric pressure of the atmosphere; and a controller for controlling said adjustment means in accordance with a detection output of said detector.

13. An apparatus according to claim 12, wherein said adjustment means comprises a shutter mechanism.

14. An apparatus according to claim 13, wherein said controller controls a driving profile for moving said shutter mechanism.

15. An apparatus according to claim 12, further comprising a mask chuck for holding a mask having a pattern.

16. An apparatus according to claim 15, wherein said mask chuck holds the mask in the atmosphere at a position proximate to the substrate.

17. An apparatus according to claim 12, further comprising a radiation source for emitting the X-rays for exposure.

18. An apparatus according to claim 17, wherein said radiation source comprises a synchrotron radiation (SOR) device.

19. An X-ray exposure method comprising:

holding a substrate in atmosphere;

detecting information corresponding to atmospheric pressure of the atmosphere; and controlling an amount of X-ray exposure to the substrate in accordance with the atmospheric pressure information detected in said detecting step.

* * * * *

UNITED STATES PATENT AND TRADEMARK OFFICE
CERTIFICATE OF CORRECTION

PATENT NO. : 5,347,561
DATED : September 13, 1994
INVENTOR(S) : Ryuichi Ebinuma

It is certified that error appears in the above-indentified patent and that said Letters Patent is hereby corrected as shown below:

ON THE COVER PAGE: (Item 56)

UNDER "U.S. PATENT DOCUMENTS":

The following should be inserted:

--5,138,643   8/1992  Sakamoto, et al. ...... 378/34
  5,168,512  12/1992  Iwamoto, et al.  ...... 378/34
  5,172,402  12/1992  Mizusawa, et al. ...... 378/34--.

COLUMN 5:

Line 46, "= $\Delta t \int_x$" should read --= $\Delta t \int_\lambda$--.

COLUMN 7:

Line 39, "preprocess" should read --pre-process--; and
Line 42, "postprocess" should read --post-process--.
Line 42, "(assembly process) should read --(assemby process).

Signed and Sealed this

Ninth Day of May, 1995

Attest:

BRUCE LEHMAN

*Attesting Officer*           *Commissioner of Patents and Trademarks*